United States Patent [19]

Ainsworth et al.

[11] Patent Number: 4,999,764
[45] Date of Patent: Mar. 12, 1991

[54] METHOD OF SETTING UP APPARATUS FOR HANDLING ELECTRICAL OR ELECTRONIC COMPONENTS

[75] Inventors: Steven J. H. Ainsworth; Derek R. Dane, both of Colchester, England

[73] Assignee: Emhart Inc., Towson, Md.

[21] Appl. No.: 295,968

[22] Filed: Jan. 11, 1989

[30] Foreign Application Priority Data

Jan. 28, 1988 [GB] United Kingdom ............... 8801896
May 12, 1988 [GB] United Kingdom ............... 8811253

[51] Int. Cl.$^5$ .............................................. G05B 1/06
[52] U.S. Cl. .............................. 364/167.01; 358/101
[58] Field of Search ............... 364/167.01, 488–491, 364/474.34, 474.35, 559, 468, 469; 382/9, 23; 318/568.22, 638, 640; 358/101; 29/739, 740, 759

[56] References Cited

U.S. PATENT DOCUMENTS

| | | | |
|---|---|---|---|
| 3,988,535 | 10/1967 | Hickman et al. | 178/6.8 |
| 4,233,625 | 11/1980 | Altman | 358/101 |
| 4,342,090 | 7/1982 | Caccoma et al. | 364/491 |
| 4,638,232 | 1/1987 | Stridsberg et al. | 318/640 |
| 4,651,203 | 3/1987 | Peterson | 358/101 |

FOREIGN PATENT DOCUMENTS

| | | |
|---|---|---|
| 0066883 | 12/1982 | European Pat. Off. . |
| 1142774 | 2/1969 | United Kingdom . |
| 2045970 | 11/1980 | United Kingdom . |
| 85/03368 | 8/1985 | World Int. Prop. O. . |
| 85/03404 | 8/1985 | World Int. Prop. O. . |

*Primary Examiner*—Jerry Smith
*Assistant Examiner*—Paul Gordon
*Attorney, Agent, or Firm*—Spencer T. Smith

[57] ABSTRACT

A setting-up plate is mounted on an X-Y table of a component placement machine. The plate has an array of fiducial marks thereon whose positions are accurately known. A control system drives the table by an amount which should bring each mark in turn to a reference point of a detecting device. The detecting device detects the actual position of the mark relative to the reference point. Errors in the table drive are thereby detected and can be allowed for.

2 Claims, 2 Drawing Sheets

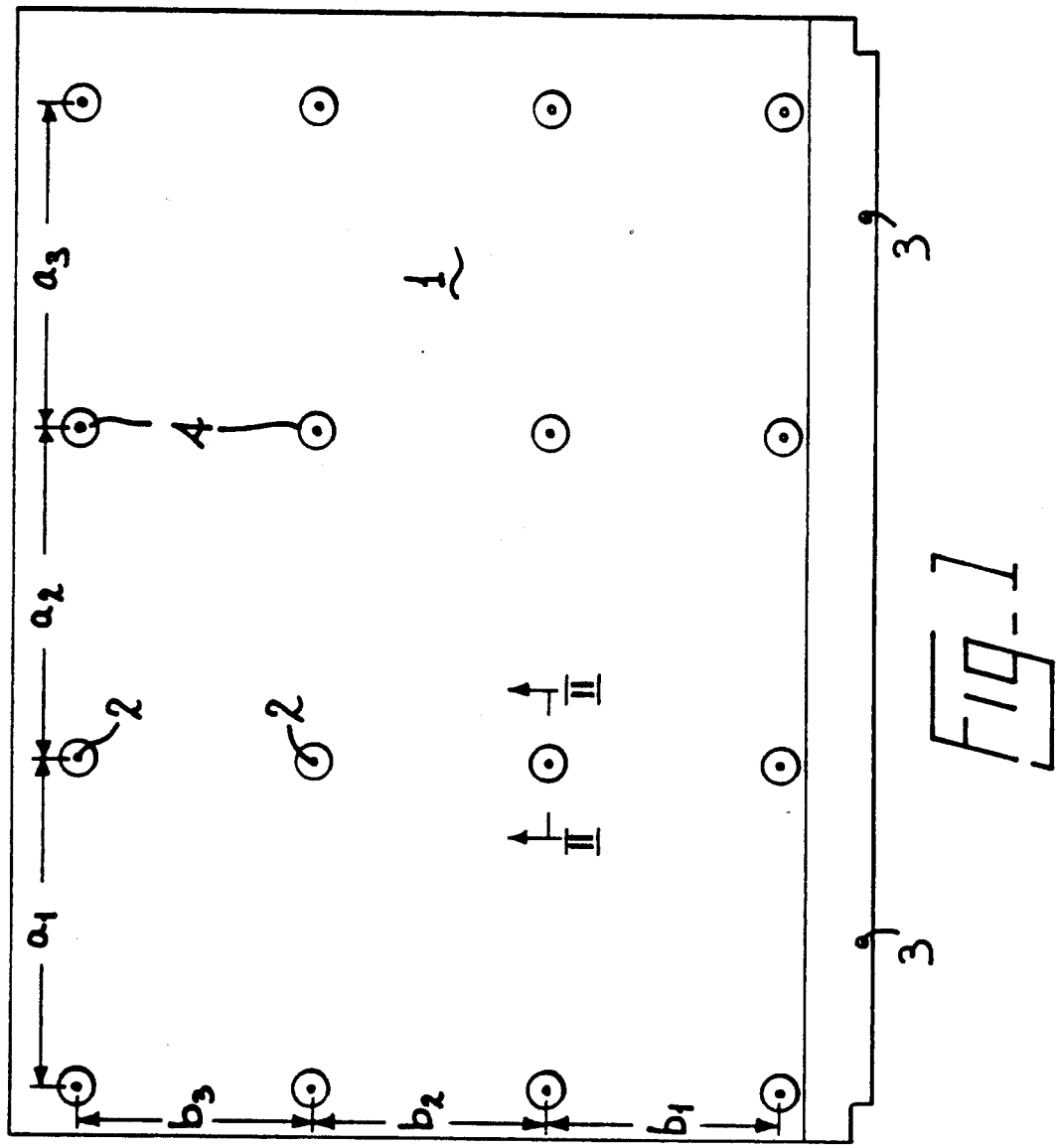

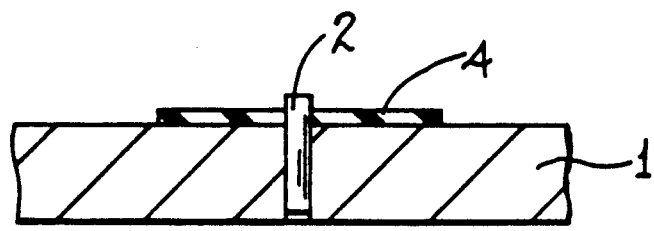
Fig_2
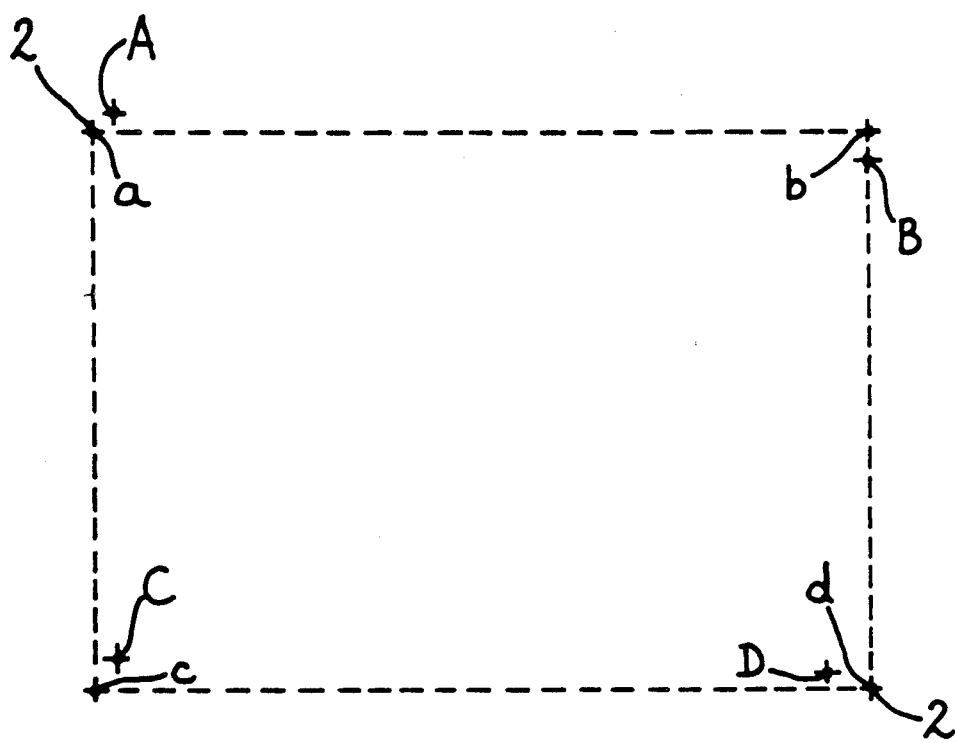
Fig_3

METHOD OF SETTING UP APPARATUS FOR HANDLING ELECTRICAL OR ELECTRONIC COMPONENTS

BACKGROUND OF THE INVENTION

This invention relates to a method of setting up apparatus for handling electrical or electronic components, for example in a component placement machine. The components may be of a variety of shapes and sizes, for example so-called flat packs, S.O style transistors, leadless chip carriers, dual in line packages, melf type components and the like, as well as so-called "chips".

In the manufacture of electrical or electronic apparatus it is necessary to assemble a plurality of components on a suitable substrate, for example a printed circuit board. A number of systems have been proposed for handling the components to be placed on a substrate and many of these have proposed the use of pick-up heads having a suitable tool by which a component may be picked up. The tools have been of various types, depending to some extent on the components to be handled; for example the tools may grip the components mechanically or may use suction or a magnetic system to retain a component on the tool of the pick-up head when the component is removed from a suitable component supply means for delivery elsewhere, for example to a suitable placement position where the component may be placed on a substrate e.g. a printed circuit board. It is important to ensure that the components are correctly oriented when placed on the substrate and a number of methods have been proposed to attempt to ensure correct orientation.

In component placement machines of the type described, the substrate, for example a printed circuit board, on which the components are to be placed, is mounted in an accurately known position on an X-Y table, suitably mounted on a frame. The X-Y table may be mounted and driven by any suitable means, a number of which are known, and one such means for mounting and driving an X-Y table is described by way of example in our PCT patent application Publication No. W.O. 85/03404.

Whilst the movement of the X-Y table can in theory be determined accurately and precisely by control of its drive mechanism, there can in practice be some deviation between the theoretical and the actual response of the table to the drive mechanism. This can result in a deviation from the intended location of the X-Y table, and hence the substrate mounted on it, which can lead to inaccurate placement of a component on the substrate.

Clearly if this inaccuracy in placement of the component exceeds any permissible tolerance, then an unacceptably high reject rate for the completed substrates will result.

G.B. patent Specification No. 1 142 774 has addressed the problem of deviations in X-Y response in relation to numerically controlled devices such as plotters, machine tools or the like. The method described in that patent specification involves driving a part to a number of different positions relative to a reference member, detecting the true position of the part using a measuring device such as a laser interferometer, and storing a table of error values for future use in correcting table drive. This method requires the presence of a very accurate measuring device for measuring the parts position relative to the origin of the X-Y table coordinate system whenever the X-Y table is calibrated.

PCT patent Specification No. WO 85/03368 describes a calibrating system in which a plate with calibration marks thereon is mounted on a table which is movable in the X direction beneath a head which is movable in the Y direction. The x drive is utilized to drive to an x value which should correspond to a calibration point. If the calibration point is not located under a calibration probe used to provide a reference point, the x drive is utilized to move the plate by small amounts until the point is correctly located. The procedure is then repeated for y values using the same or a different, but nearby calibration point. This system is not concerned with an X-Y table and is time consuming since numerous attempts may be necessary to detect the calibration point in the x direction, as the calibration probe is only able to detect whether or not the point is correctly located, and then further attempts may be necessary for the y direction.

SUMMARY OF THE INVENTION

An object of the present invention is to provide an improved method of setting up a component placement machine in which any inaccuracy in the positioning of a point on a substrate mounted on the X-Y table relative to a reference point, which inaccuracy is due to the response of the X-Y table to its drive system, is reduced or substantially obviated.

The invention provides a method of setting up a component placement machine, comprising a pick-up head having a pick-up tool, and an X-Y table on which substrates on which components are to be placed may be mounted to account for errors in the X-Y table drive utilizing a detecting device having a two dimensional field of view and operable to detect the position of a fiducial mark, as herein defined, within said field of view relative to a reference point of the device, comprising the steps of:

(a) mounting a setting-up plate, provided with an array of fiducial marks, having accurately known x,y coordinates relative to the plate, in an accurately known position on the X-Y table by means of aligning location points of the X-Y table and the setting-up plate;

(b) informing a control system of the table drive of said known x,y coordinates of the fiducial marks in the array;

(c) causing the control system to drive the X-Y table to a position where the reference point of the detecting device is expected to coincide with one of said fiducial marks;

(d) utilizing the detecting device to detect the actual position of said mark relative to the reference point;

(e) determining the x and y distances between said actual position and said reference point and;

(f) repeating steps (c) to (e) for each mark in the array.

By the term "fiducial mark" where used herein is to be understood a mark whose position is precisely known relative to location points of a plate on which the mark is located.

By utilizing a method according to the last but one preceding paragraph, corrections can be made for the errors in the X-Y table drive. In driving to a particular position, the known errors in driving to the positions of fiducial marks adjacent to said particular position can be taken into account to produce a more accurate drive.

In a preferred embodiment of the method according to the invention, the method further comprises the steps of:

(g) driving the X-Y table to the fiducial mark positions applying a correction which takes account of the distances determined in step (e) and (h) checking that the actual position of each fiducial mark is within acceptably small x and y distances from the reference point.

By incorporating steps (g) and (h) in the method according to the invention, it is possible to confirm that appropriate corrections are being made for the errors in the X-Y table drive.

The distances determined in step (e) enable the x,y coordinates of the actual positions of fiducial marks to be determined from the known coordinates of the fiducial marks relative to the plate. Hence, for each area within the array of fiducial marks (e.g. a rectangular area between four such marks) algorithms may be calculated for the x and y drive corrections to any point within that area based on the known x,y coordinates of the fiducial marks around said area (e.g. at the corners of a rectangular area) and on the x,y coordinates of the detected actual positions of said marks.

The detecting device preferably used in the method according to the invention is a pattern recognition camera, in particular a charge coupled device (CCD) camera, in which an array of sensors survey the field of view, and can detect and record the x,y coordinates of a point in the field of view relative to a reference point of the camera. In the method according to the present invention, the point in the field of view is the fiducial mark. The use of a camera, in particular, a CCD camera, makes it possible for the position of the fiducial mark to be detected and recorded quickly and accurately.

The setting-up plate for use in the method according to the invention preferably comprises an aluminum plate, provided with an array of fiducial marks as hereinbefore defined. Aluminum is particularly suitable for the setting-up plate for use in the method according to the invention because of its behaviour with respect to small variations in temperature such as are likely to occur in the operating conditions of the method according to the invention and because it can easily be accurately formed.

The setting-up plate for use in the method according to the invention is provided with an array of fiducial marks as hereinbefore defined. The fiducial marks are preferably in the form of pins attached to the setting-up plate, suitably drilled into the plate. Pins are particularly suitable for use as fiducial marks, as their position can be reliably determined by the detecting device, for example the CCD camera.

The fiducial marks are arranged in an array, preferably a regular rectangular array. It is preferred to position the fiducial marks in a regular rectangular array, for ease of computation of the errors in the X-Y table drive and calculation of the necessary corrections. It has in practice been found that an array of sixteen fiducial marks, arranged in a four by four array equally spaced across the setting-up plate, provides sufficient information to establish the errors in the drive of an X-Y table within satisfactory limits, and does not require excessive computation. The setting-up plate for use in the method according to the invention preferably comprises an array of sixteen fiducial marks arranged in a regular rectangular array.

BRIEF DESCRIPTION OF THE DRAWINGS

A preferred method of setting up a component placement machine according to the invention will now be further described with reference to FIGS. 1 to 3 of the accompanying drawings, in which;

FIG. 1 shows a plan view of the setting-up plate,

FIG. 2 shows a section along line II—II of FIG. 1, and,

FIG. 3 illustrates the method of calculating the correction for any point on the table.

DETAILED DESCRIPTION OF THE INVENTION

The preferred method is used for setting-up a component placement machine to account for errors in the X-Y table drive thereof. The machine comprises a CCD camera (not shown) looking downwards at the X-Y table and having a reference point at the centre of its two dimensional field of view. Conveniently, the CCD camera used may be that normally present in some machines for detecting location marks of printed circuits on a printed circuit board. A setting-up plate (1) is mounted in an accurately known position on the X-Y table by means of aligning location points (3) of the X-Y table and the setting-up plate.

The plate (1) comprises an aluminum plate on which are mounted sixteen pins (2) in a four by four array. The distances $a_1$, $a_2$, $a_3$ etc. between adjacent pins in the x-direction are nominally the same and the distances $b_1$, $b_2$, $b_3$ etc. between adjacent pins in the y-direction, are also nominally the same though not necessarily the same as the inter-pin distances in the x-direction, and are measured accurately for every inter-pin distance by known means.

The temperature at which these measurements are carried out is recorded and is marked on the plate. When the plate is subsequently used in the preferred method in the setting-up of a component placement machine, the setting up is carried out at a temperature within about 5° C. of the measuring temperature in order substantially to obviate any error due to thermal expansion or contraction of the setting-up plate.

The area of the plate (1) covered by the array of pins (2) is substantially equal to the effective working area of the X-Y table, that is the area on which components are to be placed, on a substrate which is to be mounted on the table. The pins are drilled into the plate to ensure secure fixing, and each pin may be provided with a collar (4), suitably of black rubber, to give a dark background to the pin to assist detection by the camera.

To carry out the preferred method the control system of the X-Y table is informed of the x,y coordinates of each of the pins on the setting-up plate mounted on the X-Y table, and the X-Y table is driven by means of its control system to the position where the reference point of the CCD camera is expected to coincide with a first pin i.e. the drive attempts to position the table so that the reference point of the camera is at the known x-y coordinates of the first pin.

The actual position of the pin relative to the reference point is detected using the CCD camera, and the x and y distances between the actual position and said reference point are determined by counting the number of pixels in the field of view of the camera between the detected actual position and the reference point. Thus, the error at the pin is determined.

The X-Y table is then driven by means of its control system to the position where the reference point of the CCD camera is expected to coincide with the known x,y coordinates of a second pin, and the steps of detection, and determining distances are repeated for this pin.

This process is repeated in turn until the error in the X-Y table drive has been calculated for each pin position.

In order to check that the errors have been correctly calculated and recorded, the X-Y table is then driven under its control system to each pin position, applying a correction which takes account of the errors determined, and the CCD camera is used to check that the actual position of each pin is within acceptably small x and y distances from the reference point. If not, the method is repeated for that pin.

The setting-up plate is then removed from the X-Y table, and the component placement machine can be used for the placing of components on a substrate. In order to explain more clearly how the measurements taken in the setting-up process can be used in the control system of the X-Y table to correct for errors, an example of the calculation required will now be given, with particular reference to FIG. 3 of the accompanying drawings, in which any four adjacent pins a, b, c and d of the array are shown at known coordinates $a_x, a_y; b_x, b_y; c_x, c_y;$ and $d_x, d_y$. These pins were detected at A, B, C and D and found to have coordinates of $A_x, A_y; B_x, B_y; C_x, C_y;$ and $D_x, D_y$, $A_x$ being $a_x$ plus the x error detected at a, and so on.

When scaling generally along the x axis between points C and D the x axis scaling factor is given by $$(D_x-C_x)/(d_x-c_x)$$

and this is multiplied by x to give the corrected value X at any point along the line between c and d.

Thus, $X=((D_x-C_x)/(d_x-c_x)) x$ or $X=x\pm(((D_x-C_x)/(d_x-c_x))-1) x$ or $X=x\pm(D_x-C_x-d_x\pm c_x) x/(d_x-c_x)$.

so that the scaling factor $K=(D_x-C_x-d_x\pm c_x)/(d_x-c_x)$.

Similarity scaling between points A and B along the x axis gives a scaling factor $L=(B_x-A_x-b_x\pm a_x)/(b_x-a_x)$.

Now considering variable x scaling depending on y, this is given by $X=x\pm Lx\ (y/(a_y-c_y))\pm Kx\ (1-(y/(a_y-c_y)))$ or $X=x\pm Lx\ (y/(a_y-c_y))\pm Kx-Kx\ (y/(a_y-c_y))$ or $X=x\pm Kx\pm((Lx-Kx)/(a_y-c_y))\ y$ or $X=x\pm Kx\pm Mxy$, where $$M=(L-K)/(a_y-c_y)$$

If point c is taken as a reference, i.e. (0,0), for any value of y if x=0 then the scaling is also 0, therefore, any x displacement is due to axis skew.

Axis skew on line c to a is $((A_x-C_x)-(a_x-c_x))/(a_y-c_y)$
$X=((A_x-C_x-a_x\pm c_x)/(a_y-c_y))\ y$ $X=Ny$ where $N=(A_x-C_x-a_x\pm c_x)/(a_y-c_y)$.

So the total correction is given by $X=x\pm Kx\pm Mxy\pm Ny$ and hence this is the algorithm calculated for the x drive correction for driving to any point within the rectangular area bounded by a, b, c and d which is based on the coordinates of a, b, c and d and of A, B, C and D.

By a similar calculation on the y axis, $Y=y\pm Py\pm Sxy\pm Tx$, which is the algorithm for y drive correction where $P=(A_y-C_y-a_y\pm c_y)/(a_y-c_y)$
$S=(R-P)/(d_x-c_x)$ where $R=(B_y-D_y-b_y\pm d_y)/(b_y-d_y)$ and
$T=(D_y-C_y-d_y\pm c_y)/(d_x-c_x)$.

We claim:

1. A method of setting up a component placement machine comprising a pick-up head having a pick-up tool, an X-Y table on which substrates on which components are to be placed may be mounted, and a control system for the X-Y table comprising the steps of:

(a) mounting a setting-up plate, provided with an array of fiducial marks having accurately known X-T coordinates relative to the plate, in an accurately known position on the X-T table by means of aligning location points of the X-Y table and the setting up plate, (b) inputting into the control system said known X-Y coordinates of said fiducial marks in the array, (c) causing said control system to sequentially locate each fiducial mark at a known position, (d) locating a camera having a field of view defined by an X-Y array of pixels so that the X-Y array of pixels is oriented to correspond to the X-Y array of fiducial marks and so that a selected pixel will see said know position, (e) for each fiducial mark located at said known position, determine the actual pixel which locates said fiducial mark and determine the number of pixels in the X line of pixels and in the Y line of pixels required to relocated that pixel to said selected pixel, and (f) defining based on such number of pixels, X-Y corrections for said control system when locating the X-Y table.

2. A method according to claim 1 wherein the camera is a charge coupled device camera.

* * * * *